United States Patent [19]

Kapany et al.

[11] Patent Number: 4,934,784
[45] Date of Patent: Jun. 19, 1990

[54] HYBRID ACTIVE DEVICES COUPLED TO FIBER VIA SPHERICAL REFLECTORS

[75] Inventors: Narinder S. Kapany, Woodside; Fred C. Unterleitner, Palo Alto, both of Calif.

[73] Assignee: Kaptron, Inc., Palo Alto, Calif.

[21] Appl. No.: 325,624

[22] Filed: Mar. 20, 1989

[51] Int. Cl.$^5$ .......................... G02B 6/32; G02B 6/34; H04B 9/00; H01J 3/08
[52] U.S. Cl. ........................... 350/96.18; 350/96.19; 350/96.20; 350/162.23; 350/96.16; 370/3; 372/99; 372/102; 372/101
[58] Field of Search ............... 350/96.15, 96.16, 96.17, 350/96.18, 96.19, 96.20, 162.2, 162.23; 370/3; 372/99, 101, 102

[56] References Cited

U.S. PATENT DOCUMENTS

| | | | |
|---|---|---|---|
| 4,329,017 | 5/1982 | Kapany et al. | 350/96.15 |
| 4,550,410 | 10/1985 | Chenausky et al. | 372/99 |
| 4,634,215 | 1/1987 | Reule | 350/96.16 |
| 4,643,519 | 2/1987 | Bussard et al. | 350/96.19 |
| 4,651,315 | 3/1987 | Laude | 370/3 |
| 4,714,313 | 12/1987 | Kapany et al. | 350/96.16 |
| 4,722,582 | 2/1988 | Modone et al. | 350/96.15 |
| 4,746,186 | 5/1988 | Nicia | 350/96.18 X |
| 4,749,247 | 6/1988 | Large | 350/96.16 |
| 4,755,017 | 7/1988 | Kapany | 350/96.18 |
| 4,767,171 | 8/1988 | Keil et al. | 350/96.18 |
| 4,797,894 | 1/1989 | Yaeli | 372/99 X |
| 4,800,557 | 1/1989 | Weber | 370/3 |
| 4,819,224 | 4/1989 | Laude | 370/3 |
| 4,836,634 | 6/1989 | Laude | 350/96.19 |
| 4,854,663 | 8/1989 | Borsuk et al. | 350/96.20 |
| 4,859,017 | 8/1989 | Brierley et al. | 350/96.15 |
| 4,872,179 | 10/1989 | Nitsche et al. | 372/99 |

FOREIGN PATENT DOCUMENTS 2165061 4/1986 United Kingdom ......... 350/96.19 X

OTHER PUBLICATIONS

Soares, "Self Imaging Devices for Optical Comm." SPIE vol. 213 Optics and Photonics (1979) pp. 40–43.
Yen et al., "Planar Rowland Spectrometer . . . " Optics Lett. vol. 6 No. 12 12/81, pp. 639–641.

*Primary Examiner*—William L. Sikes
*Assistant Examiner*—Brian M. Healy
*Attorney, Agent, or Firm*—Townsend and Townsend

[57] ABSTRACT

Multiple reflection modules having as a light source or a light target a lensed optical fiber employ one more spherical reflectors and wavelength selectors for selecting the wavelengths of optical radiation on selected optical paths between said light source and said light target. The reflection module may be a multiplexer or a laser cavity. As a laser, it may include as a source a semiconductor laser comprising a laser source disposed to direct radiation through a first multiple layer dielectric Fabry-Perot cavity with the center of curvature between the source and a fiber tip to which output energy is to be coupled, and a second reflector mounted behind the first reflector, the second reflector being a full reflector with the center of curvature at the laser source. The first reflector may have a narrow-band optical transmissivity characteristic intended to permit only a narrow band of optical radiation to be coupled to the full reflector, the full reflector disposed as a confocal relfective surface of the laser cavity. Reflections from the first reflector are coupled to a tip of an optical fiber. Other embodiments of the invention are configured as multiplexers. Still other embodiments employ a diffraction grating as part of a laser cavity or as a frequency-selective multiplexer.

5 Claims, 4 Drawing Sheets

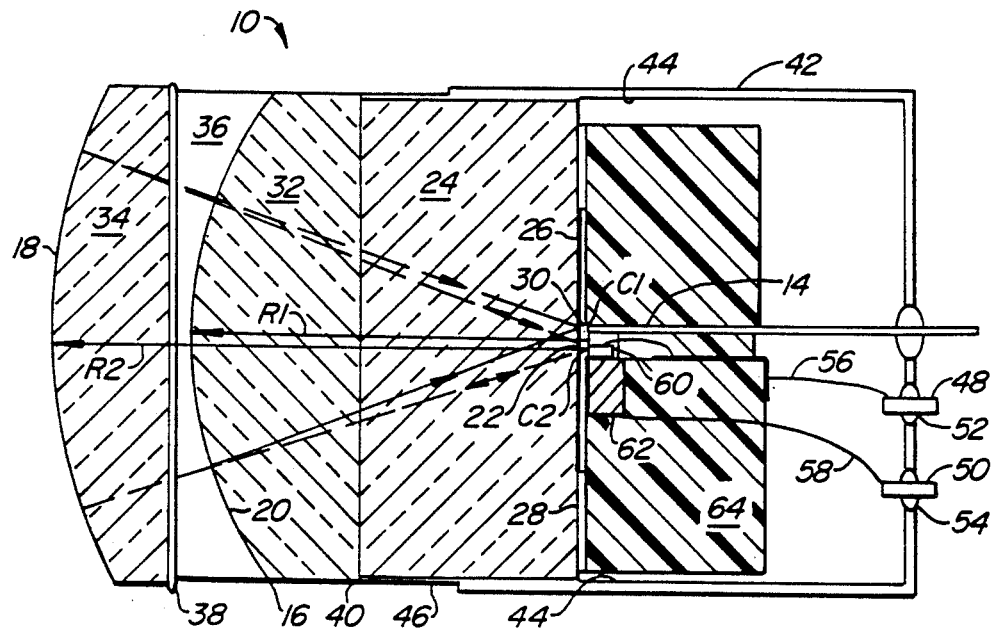
FIG._1.
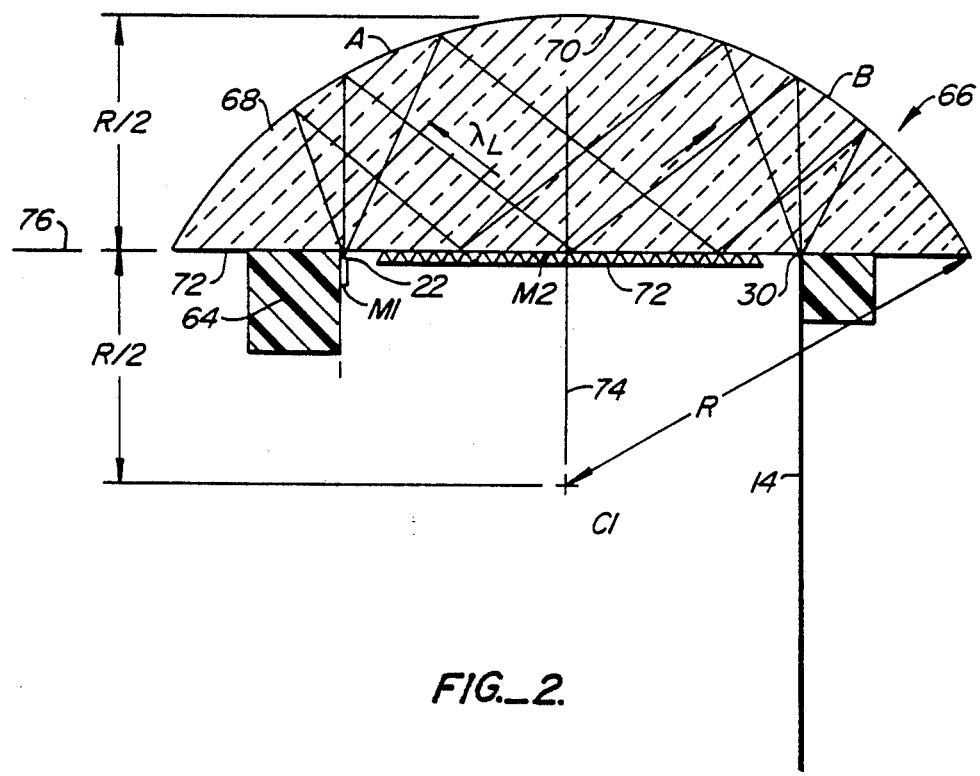
FIG._2.

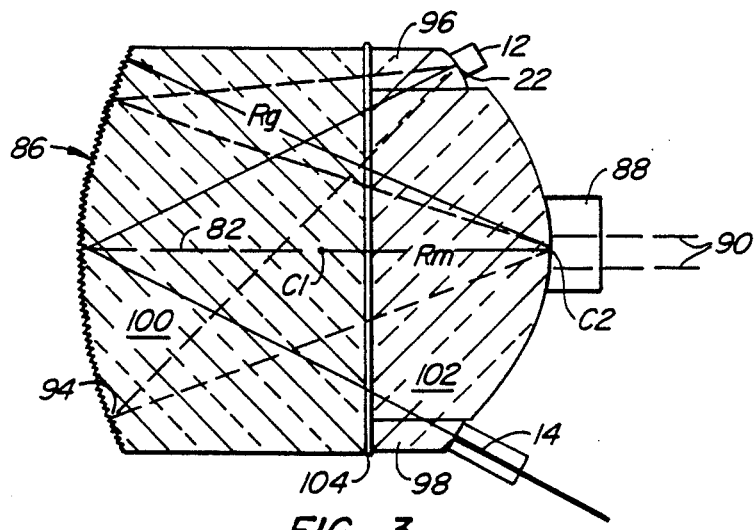
FIG._3.
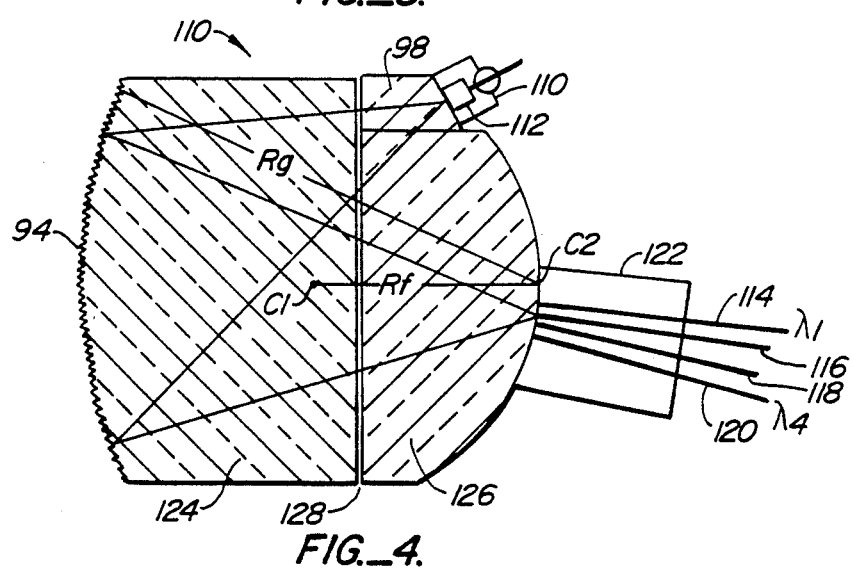
FIG._4.
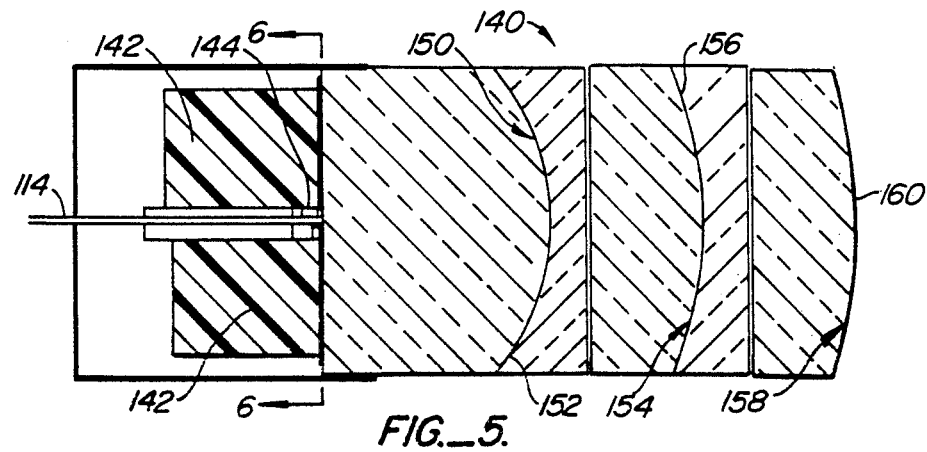
FIG._5.

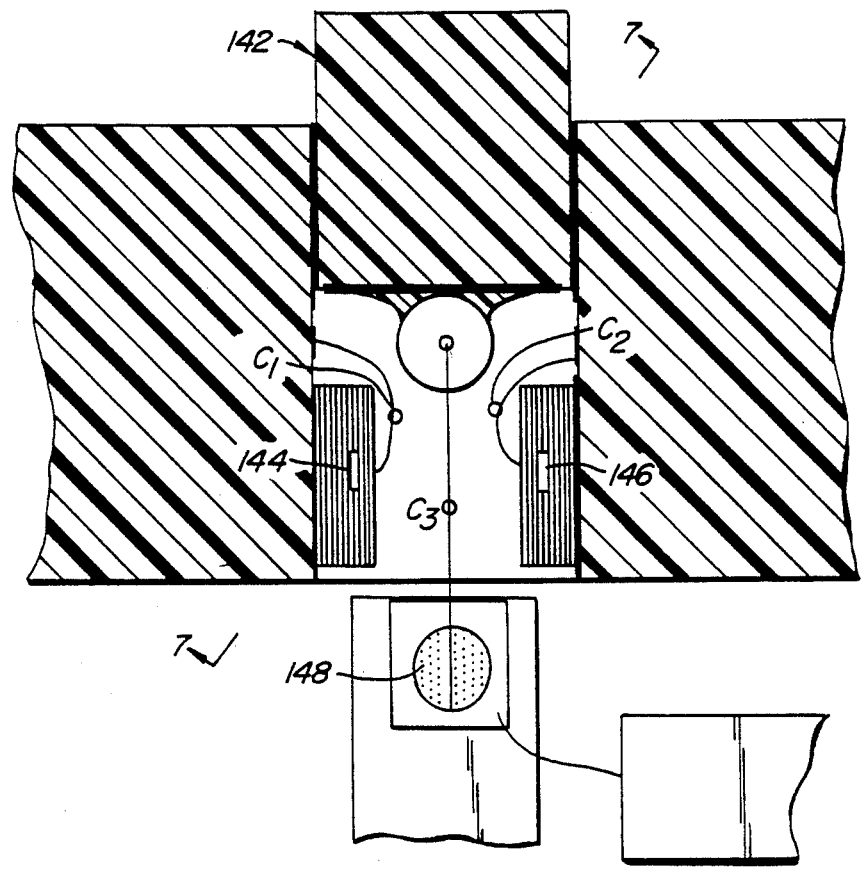
FIG._6.
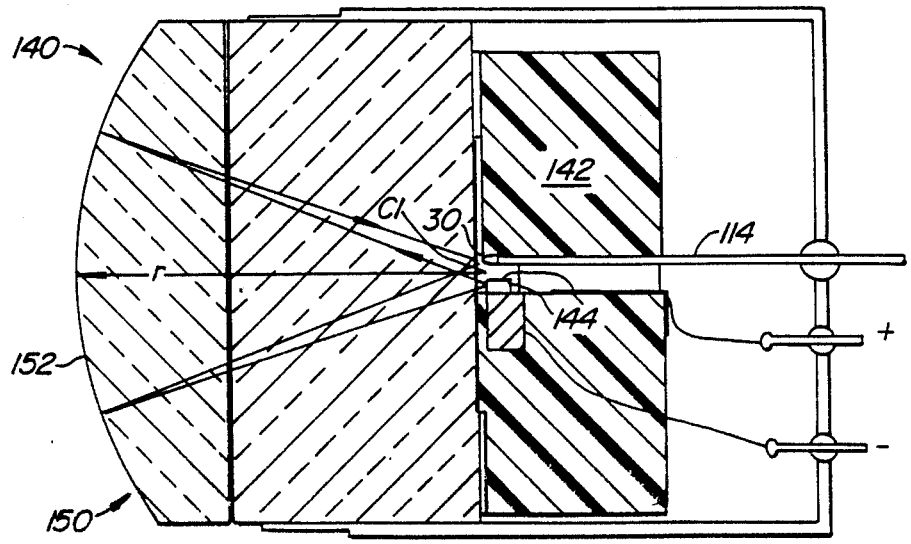
FIG._7.

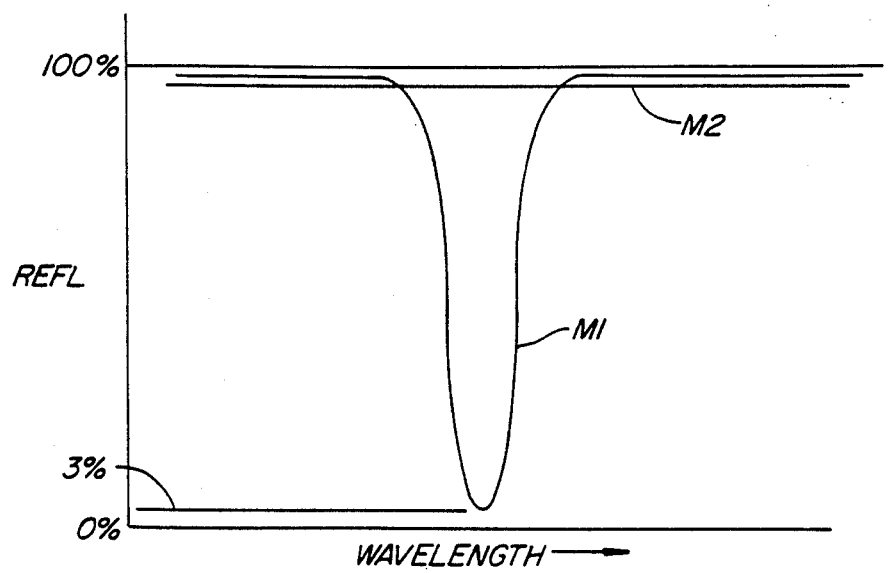
FIG._8.
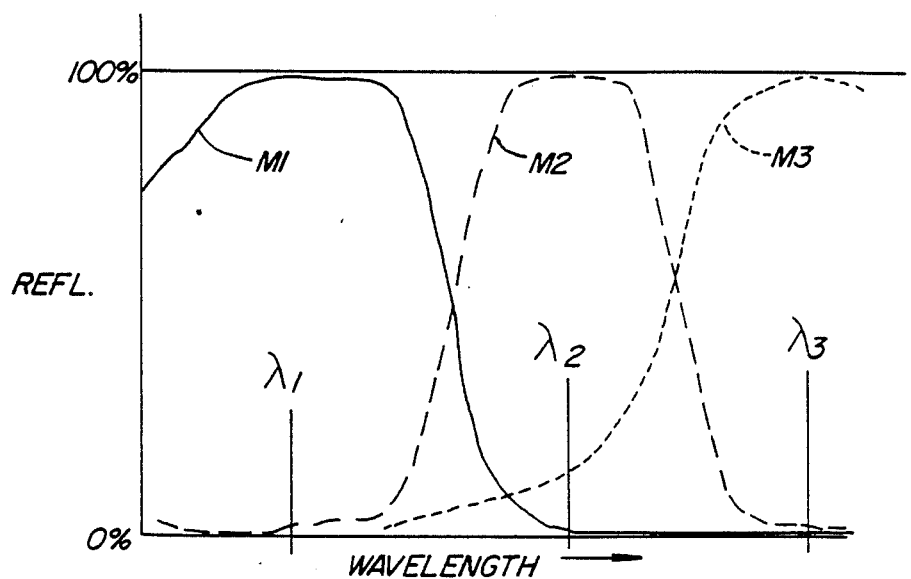
FIG._9.

HYBRID ACTIVE DEVICES COUPLED TO FIBER VIA SPHERICAL REFLECTORS

BACKGROUND OF THE INVENTION

This invention relates generally to optical fiber communications, and more specifically, to modules for selectively coupling light to and from optical fibers through the use of spherical reflectors in connection with wavelength-selection functions. Functions include multiplexing of selective wavelengths in a single or into multiple fibers and generation of stimulated emission of light within narrow wavelengths.

The primary application of the devices is in the fiber optic communication wherein wavelength division multiplexing using wavelength-sensitive directional couplers may prove to be very useful.

This invention further relates to further developments in modules wherein fiber holding substrates and optical sources are mounted in hybrid packaging.

Prior art patents include the following patents owned by the assignee of the present invention. The following patents disclose hybrid optical fiber couplers: U.S. Pat. No. 4,329,017 discloses a fiber optic coupler in conjunction with a monitor receiving optical energy through a coated spherical face, as well as a multiplexer which employs a grating on a spherical surface as a frequncy selector. U.S. Pat. No. 4,479,697 discloses in FIG. 6 a star coupler wherein a first curved surface is characterized by low reflectivity adjacent an air interface with a highly reflective curved reflector. U.S. Pat. No. 4,755,017 describes construction of a class of fiber optic communication modules which use curved reflectors. These devices utilize LED sources and silicon PIN detectors in connection with an optical assembly housed in a package having a fiber pigtail. The practical application in the present invention is in coupling to single mode optical fibers, either singly or assembled in an array of pigtails.

SUMMARY OF THE INVENTION

According to the invention, there is provided a multiple reflection module having as a light source or a light target a lensed optical fiber, a spherical reflector disposed in an optical path between the light source and said light target, and a wavelength selector for selecting wavelength of optical radiation on the optical path between said light source and said light target. The reflection module may be a multiplexer or a laser cavity. As a laser, it may include as a source a semiconductor laser comprising a laser source disposed to direct radiation through a first multiple layer dielectric Fabry-Perot cavity with the center of curvature between the source and a fiber tip to which output energy is to be coupled, and a second reflector mounted behind the first reflector, the second reflector being a full reflector with the center of curvature at the laser source. The first reflector may have a narrow-band optical transmission characteristic intended to permit only a narrow band of optical radiation to be coupled to the full reflector, the full reflector disposed as a confocal reflective surface of the laser cavity. Reflections from the first reflector are coupled to a tip of an optical fiber cable mounted adjacent and typically within 100 microns of the laser source.

A second semiconductor laser cavity comprises a semiconductor laser diode disposed to direct radiation to a spherical mirror at an offset from the center of curvature, which in turn reflects the radiation to a blazed diffraction grading disposed at a radius of one half of the radius of the center of curvature such that a selected order of reflection is directed as feedback through backscatter to the laser source. Zero-width order, e.g., specular reflection, is limited in transmissivity but is sufficient to give output coupling. Optical energy intended for output coupling is directed to a second portion of the spherical mirror, which is reflected to a receiving tip of a lensed fiber for output to a fiber optic pigtail.

A further embodiment of the invention employs a diffraction grating laser which comprises a laser diode disposed with its front facet on the surface of a spherical mirror offset from a center of radius and disposed to direct radiation toward a spherical grading having a radius of curvature of twice that of the spherical reflector, and an output fiber having a lensed tip disposed at the position of the zero-width order of reflection from the spherical grading. Radiation is directed to the optical grating, which is reflected back to a reflective spot at which is mounted a concave mirror with an aperture defining a small reflective spot having radius of curvature one half of that of the curvature of the grating. Radiation received at the concave mirror is reflected again to the grating, which redirects the radiation in a high order reflection back to the laser source. The reflection order is selected to provide a high degree of reflection off of the grating. The zero-width order reflection is limited in reflectivity such that the specular reflection gives output coupling to the lensed optical fiber while the grating maintains oscillation within the spherical cavity.

A modification of the foregoing concept provides for a light emitting diode (LED) mounted on the radius of curvature of a first spherical surface wherein radiation is directed to a grating on a second spherical surface with a radius of curvature twice that of the first spherical surface, wherein a bundle of individual fibers is mounted in radial groves on a plane surface along the radius of curvature of the first spherical surface. The grating reflects essentially all radiation from the LED in high orders, redirecting the radiation according to the wavelength of incident radiation toward selected lensed fibers on the plane surface. Wavelength adjustment can be effected by translation of the lensed fibers along the first spherical surface thereby to permit wavelength selective output of the LED to a number of lensed optical fibers.

A still further embodiment comprises a first spherical reflector having a first radius of curvature, a second spherical reflector having a second radius of curvature and a third spherical reflector having a third radius of curvature, all mounted in a stack and aligned such that the center of curvature is in a common plane containing selected sources, detectors and lensed optical fibers. An example of a two-source, single-fiber, single-detector configuration is described. Each of the spherical reflectors is optically coated with an appropriate long wave pass dielectric coating whereby each reflector is specific to a unique source and target.

The invention will be better understood by reference to the following detailed description in connection with the accompanying drawings.

BRIEF DESCRIPTION OF THE DRAWINGS

FIG. 1 is a side cross-sectional view of a dielectric multiple reflection resonator tuned semiconductor laser in accordance with the invention.

FIG. 2 is a side cross-sectional view of a grading tune semiconductor laser according to a first embodiment.

FIG. 3 is a side cross-sectional view of a grading tune semiconductor laser according to the second embodiment.

FIG. 4 is a side cross-sectional view of a grading tuned multi-wavelength division multiplexer.

FIG. 5 is a side cross-sectional view of a dielectric coating tuned multi-wavelength multiplexer according to the invention.

FIG. 6 is a top plan view of substrate assembly of the multiplexer along a sightline 5—5 of FIG. 5.

FIG. 7 is a side cross-sectional view along a sightline 7—7 containing one coupling set in accordance with the structures of FIGS. 5 and 6.

FIG. 8 is a spectral diagram of the reflectivity of the mirrors of FIG. 1.

FIG. 9 is a spectral diagram of the reflectivity of the mirrors of FIG. 5.

DESCRIPTION OF SPECIFIC EMBODIMENTS

Referring to FIG. 1 there is shown a side cross-sectional view of a fiber optic coupler 10 according to one embodiment of the invention. The coupler 10 incorporates a semiconductor laser in a tuned cavity, comprising a laser diode light source 12, a lensed optical fiber light target 14, a first spherical reflector 16, a second spherical reflector 18 and a dielectric coating 20 on the surface of the first spherical reflector 16.

The laser diode source 12 has an anti-reflection surface 22, preferably disposed adjacent a solid metallized glass element 24 having on its optical interface 26 an anti-reflection coating 28. The lensed optical fiber light target 14 has a concave lens at its tip 30 in essentially the same plane as the anti-reflection surface 22. The laser diode light source 12 has its anti-reflection surface 22 disposed at a first position in a plane including a first center of curvature $C_1$ of the first spherical reflector 16 and second center of curvature $C_2$ of the second spherical reflector 18 with the lensed optical fiber light target 14.

The lensed optical fiber light target 14 has a lensed tip 30 which is disposed at a second position adjacent the plane. The lensed optical fiber light target 14 has an axis (defined by a ray along the center of the fiber) which is aligned with incident light along the path of intended light propagation. The center of curvature $C_1$ of the first spherical reflector 16 is halfway between the surface 22 and the tip 30. The relevant radius curvature R1 of the first spherical reflector 16 is in the common plane of the surface 22, the center of curvature $C_1$ and the tip 30. The tip 30 may be disposed in this plane at a position along the fiber axis optimized to receive and collimate incident light into the optical fiber light target 14.

The dielectric coating 20 is a specially-selected dielectric. Referring the FIG. 8, there is shown a spectral diagram of the reflectivity of the first spherical reflector 16 of FIG. 1 bearing the coating 20 as curve M1. Curve M2 is the spectral diagram of the second spherical reflector. Reflector 16 has essentially 100% reflectivity across its spectrum, except for a very narrow-wavelength spectrum selected to be centered at the optimal optical output of the laser diode source 12, namely in the gain profile of the laser light source. At the point of minimum reflectivity, reflectivity is approximately 3%. The reflectivity of the second spherical reflector 18 is approximately 100% in the gain profile of the laser light source, and thus it has sufficient reflectivity to form one boundary of a laser resonator.

The center of curvature $C_2$ of the second spherical reflector 18 is at or is aligned with the laser diode source 12. Second reflector 18 and the internal reflective surface (not shown) of the laser diode source 12 form a confocal resonating cavity.

The spherical reflectors 16 and 18 may be formed in the surface of solid glass elements 32 and 34, respectively, separated by a spacer lens 36. Alternatively, the first spherical reflector 16 may be formed as a concave surface in the solid spacer lens 36. Spacer lens 36 and element 34 may be cemented together along a seam 38 after the respective elements have been aligned. A further alignment seam 40 is provided between element 34 and element 32.

The structure of module 10 is preferably a mounting in a hermetically-sealed can 42 whose inner walls 44 are soldered or otherwise sealably bound to the peripheral surface 46 of the metallized glass element 24. The laser diode source 12 and lensed optical fiber light target 14 are mechanically mounted on structures abutting the metallized glass element 24.

Terminals 48 and 50 are provided having feedthroughs 52 and 54 which are coupled to respective leads 56 and 58 to electrodes 60 and 62 of the laser diode source 12. The laser diode source 12 may be mounted on a heat sink 64.

In operation, radiation from laser diode source 12 is directed to the second spherical reflector 18 through the first spherical reflector 16 in the passband of the reflective coating 20 thereby forming a laser resonating cavity. A smallpercentage of the laser light in this resonating cavity is shunted by reflections from the first spherical reflector 16 which are redirected to the tip 30 of the fiber light target 14 to provide coupling to the optical fiber light target 14. Reflectivity of first spherical reflector 16 is sufficient to provide output coupling without quenching the lasing process. Energy outside the passband of the reflective coating 20 which does not match the resonant modes of the laser cavity are essentially incoherent and do not couple as coherent radiation to the fiber light target 14. Thus the output is tuned by selection of the coating characteristics of the dielectric coating 20.

Referring now to FIG. 2 there is shown a grating tuned semiconductor laser resonator 66 in accordance with the invention employing a spherical reflector 68 and a blazed diffraction grating 72. The structure shown is not to scale. The ray paths are shown offset in an exaggerated manner relative to the sphere radius to assist in understanding the geometry. A laser diode source 12 is mounted on a heat sink 64 and has an anti-reflection coating surface 22 disposed at a first position in a plane including half the radius of a center curvature $C_1$ of the spherical reflector 68. Internal to the laser diode source 12 is a reflective surface (not shown) providing one reflector of the laser cavity.

A lensed optical fiber light target 14 is disposed with its tip 30 at a second position adjacent the plane including half the radius of the center of curvature $C_1$ and the spherical reflector. The light target 14 has a fiber axis aligned with expected incident of light. The spherical reflector 68 has a broad waveband mirror coating 70 on its surface. The blazed diffraction grating 72 is disposed in the ray path of reflection between the spherical reflector 68 at a first position A and the spherical 68 at a second position B where the ray path originates at the laser diode light source 12 and terminates at the lensed fiber optic tip 30.

The spherical reflector 68 may be a solid segment of a sphere having a center $C_1$, wherein the segment is formed by a plane whose maximum distance from the surface of the reflector 68 is one half the radius of curvature R of the sphere. The center of curvature $C_1$ is on an axis 74 bisecting a baseline 76 between the light source 12 and the axis of the fiber target 14.

The blazed grating 72 serves as means for selecting a wavelength of optical radiation on the optical path between the laser diode light source 12 and the light target at tip 30. It is positioned along the plane including the baseline 76, and the diode light source 12 and the light target 14 are spaced a selected distance along the baseline 76 such that zeroeth order reflections, that is specular reflections, are along a path between the source 12 and the target 14 whereas higher order reflections have a backscatter diffraction maximum in the gain profile of the medium of the laser light source. The backscatter reflections, herein designated $\lambda_L$, must be of sufficient reflectivity to support lasing. Hence, the reflectivity in on the order of 97% whereas zeroeth order reflectivity is on the order of only 3%. Internal reflections of the solid glass segment equipped with the grating 72 exhibit such characteristics at selected spatial offsets of diode source 12 and target 14 from the center line 74. Hence, a laser resonating cavity is established by proper placement of the source 12 and the target 14.

Referring now to FIG. 3, there is shown a further embodiment of a wavelength-selective external cavity-based semiconductor laser. A laser diode light source 12 having an anti-reflection surface 22 is disposed at a first position in a plane including the center of curvature of a spherical reflector 88, a spherical grating 86 and a target 14. Internal to the source 12 is a reflective surface (not shown) providing one reflector of the cavity of the laser.

A lensed fiber optic element serves as target 14. It is disposed with its tip 30 and its axis aligned with expected incident light reflected from the laser diode light source 12.

The spherical reflector 88 is disposed in the optical path between the source 12 and the target 14, and the spherical reflector 88 has a center of curvature $C_1$ on a line 82 bisecting a baseline 84 between the source 12 and the fiber axis of the target 14. Significantly, the spherical reflector 88 is provided with an aperture 90 such that the spherical reflector 88 is reflective only of a narrow aperture of incident optical radiation. The spherical reflector 88 may be concave mirror with a small reflective spot of radius $R_m$ from the center of curvature $C_1$. It may be mounted on the surface of a plano-convex lens element 92 forming a solid optical path.

In accordance with the invention, spherical grating 86 is provided having a radius of curvature $R_g$ and a center of curvature at $C_2$ on the surface of the spherical reflector 88 which is disposed on the optical path between the light source 12 and target 14. More specifically, the center of curvature $C_2$ is on the line 82 bisecting the baseline 84, and it has a radius of curvature $R_g$ which is twice the radius of curvature $R_n$ of the spherical reflector 88.

The radius of curvature $R_g$ and characteristics of the grating surface 94 of spherical grating 86 are selected such that zeroeth-order reflections which are along the path between the light source 12 and the lensed fiber optic light target 14 are reflected from the spherical reflector 88 and the planar grating has a back scatter diffraction maximum in the gain profile of the laser light source with sufficient reflectivity upon reflection through the aperture 90 to support lasing. It will be noted that there are zeroeth-order reflections off of the grating 94 which are directed from the source 12 to the output target 14. This represents only about 3% of the coherent radiation. The remaining 97% of the reflections are directed by the grating surface 94 to the spherical reflector 96 which in turn reflects it back to the grating surface 94 to the source 12. Reflectivity is sufficiently high to support lasing.

In a specific embodiment, a first prism 96 may be used for the window of the source 12, a second prism 98 may be used as a window for the target 14, and the grating surface 94 may be on the outer surface of a first solid spherical element 100 mated to a second solid spherical element 102 along a seam 104.

Referring now to FIG. 4, there is shown an alternative embodiment of a grating-tuned fiber optic coupler 110 in which a spherical grating surface 94 is employed as a frequency selective multiplexing means. In this embodiment, it is not contemplated that coherent radiation is to be supported. The fiber optic coupler 110 has a light emitting diode as a source 112 and has as targets a plurality of output fibers 114, 116, 118 and 120 aligned in radial grooves in a fiber holder 122, the fiber holder 122 having a concave spherical face of radius $R_f$ with a center of curvature $C_1$.

The source 112 is disposed at a first position in a plane including a center of curvature $C_2$ of a spherical grating 94. The plurality of lensed fiber optic light targets 114, 116, 118 and 120 are mounted at a second position in the plane, and each has a fiber axis aligned to receive incident light reflected from the grating 94. The fiber optic light targets are disposed on a circle having a center curvature at $C_1$. The spherical grating 94 is used for selecting the wavelengths of optical radiation to be directed into each one of the fibers simultaneously. The spherical grating 94 is disposed on an optical path between the light source and the various light targets. The spherical grating 94 has its center of curvature $C_2$ on the circle of the targets, and its radius of curvature is equal to twice the radius of curvature of the circle. In other words, the radius $R_f$ is equal to one half $R_g$. The characteristics of the grating are chosen such that the center of frequency selective-reflection is in the omission spectrum of the light emitting diode source 12. In this manner, the grating can selectively direct narrow wave bands of radiation at the selected fiber targets along the target circle.

In a specific embodiment, the spherical grating 94 may be mounted on the outer surface of a plano-convex lens element 124 formed of a solid optical glass. A second plano-convex lens 126 may be cemented to the first plano-convex lens element 124 along a seam 128, aligned and secured by optically-clear cement. The multiplexing and selected adjustment of wavelength can be effected by displacement of the fiber holder 122 around the circle on the surface to the second plano-convex lens 126.

Referring to FIGS. 5, 6 and 7 together, there is shown a three-wavelength reflective coupled multiplexer 140 in accordance with a specific embodiment of the invention. FIG. 6 is a top plan view of a substrate assembly of the multiplexer 140 along a sight line 6—6 of FIG. 5. FIG. 7 is a side cross-sectional view along a sight line 7—7 of FIG. 6 The substrate assemble 142 comprises a lensed optical fiber 114, a first LED light source 144, a second LED light source 146 having a different wavelength than the first LED light source 144, and a photodetector 148, all disposed in a common plane along sight line 6—6.

The first light source 144 is disposed in a first position in a plane along sight line 7—7 normal to the common plane on sight line 6—6 and which includes a first center of curvature $C_1$ of a first spherical reflector 150. The light target is the lensed optical fiber 114 with lensed tip 30, which is disposed at a second position in the normal plane. The optical fiber 114 has a central axis substantially aligned with incident light reflected via the first spherical reflector 150. The first spherical reflector 150 is disposed in an optical path between the first light source 144 and the optical fiber 114 such that its center of curvature $C_1$ is at a position half-way between the first light source 144 and the incident light axis of the optical fiber 114. Means are provided for selecting wavelength of optical radiation on this optical path in the form of a dichroic dielectric coating 152 on the spherical surface of a first spherical reflector 150. The first coating has a first selected broadwidth wavelength reflectivity centered on a desired wavelength of the light source 144 and is substantially totally transmissive at at least two other wavelengths, as represented by the transmissivity characteristic curve $T_1$ of FIG. 9.

The second light source 146 is disposed in a planar region in a second position in a plane including a second center of curvature $C_2$ (FIG. 6) of a second spherical reflector 154) FIG. 5. The light target is also the optical fiber 114, which is positioned in the same plane center of curvature $C_2$ and second light source 46, with the axis of the optical fiber 114 substantially aligned with incident light.

The center of curvature $C_2$ is half-way between the second light source 146 and the optical fiber 114. Second means for selecting the wavelength of optical radiation comprises a second dichroic dielectric coating 156 on the surface of the second spherical reflector 154. The coating 156 has a second selected broadwidth wavelength reflectivity which is centered on the characteristic emission wavelength of the second light source 146. It exhibits transmissivity at other wavelengths. The selected transmissivity is represented by the curve $T_2$ of FIG. 9. Significantly, curve $T_1$ has a minimal reflectivity characteristics at the center of emission of the second light source 146.

A third light source, which may in fact be the optical fiber 114, is disposed in a third position in a plane normal to the common plane 6—6 including a third center of curvature $C_3$ of a third spherical reflector 158. A third light target, which in this embodiment is a photodetector 148, is disposed at a third position to receive light reflected from the third spherical reflector 158. The third center of curvature is half-way between the optical fiber 114 and the third light target 148. The photodetector 148 is also positioned such that the second spherical reflector 154 as well as the first spherical reflector 152 are disposed between the third spherical reflector 158 and the optical fiber 114. The reflectivity of the third spherical reflector 158 may be determined by a broad waveband coating 160 with maximum reflectivity centered on a selected wavelength of the light emitted from the optical fiber 114, as for example represented by transmissivity curve $T_3$ of FIG. 9. Significantly, transmissivity of curve $T_1$ and $T_2$ are minimal at the selected wavelength of light emitted from optical fiber 114.

The structure of FIGS. 5 and 6 having wavelength reflective characteristics of FIG. 9 permit simultaneous bidirectional coupling of wavelength-selective radiation through optical fiber 114.

The invention has now been described with reference to specific embodiments. Other embodiments will be apparent to those of ordinary skill in the art. It is therefore not intended that this invention be limited, except as indicated in the appended claims.

We claim:

1. A fiber optic coupler module wherein either a source or a target is a lensed optical fiber, said module comprising:
   a laser light source having an anti-reflective surface disposed at a first position in a plane including a first center of curvature of a first spherical reflector and a second center of curvature of a second spherical reflector, a reflective surface of said laser light source providing one reflector of a laser cavity;
   a lensed optical fiber light target disposed with a tip at a second position adjacent said plane and a fiber axis aligned with incident light;
   a first spherical reflector disposed in an optical path between said light source and said light target, said first reflector having its center of curvature halfway between said light source and said fiber axis of said light target;
   means for selecting wavelength of optical radiation on said optical path between said light source and said light target comprising a Fabry-Perot dielectric coating on a surface of said first spherical reflector, said coating having selected narrow-width wavelength transmissivity centered on a desired lasing wavelength of said light source; and
   a second spherical reflector disposed in an optical path between said light source and said light target, said first spherical reflector being located between said second spherical reflector and said light source, said second spherical reflector having its center of curvature at said light source to define a stable optical cavity.

2. A fiber optic coupler module wherein either a source or a target is a lensed optical fiber, said module comprising:
   a laser light source having an anti-reflective surface disposed at a first position in a plane including half the radius of a center of curvature of a spherical reflector, a reflective surface of said laser light source providing one reflector of a laser cavity;
   a lensed optical fiber light target disposed with a tip at a second position adjacent said plane and a fiber axis aligned with incident light;
   a spherical reflector having at least two portions disposed in an optical path between said light source and said light target for twice reflecting light on said optical path, said spherical first reflector having its center of curvature on an axis bisecting a baseline between said light source and said fiber axis of said light target; and
   planar grating means for selecting wavelength of optical radiation on said optical path between said light source and said light target, said planar grating means being disposed in a plane including said baseline such that zeroeth order reflections of said second reflector are along a path between said laser light source and said lensed optical fiber light target, said planar grating having a backscatter diffraction maximum in the gain profile of said laser light source with sufficient reflectivity to support lasing.

3. A fiber optic coupler module wherein either a source or a target is a lensed optical fiber, said module comprising:
- a laser light source having an anti-reflective surface disposed at a first position in a plane including a center of curvature of a spherical reflector, a reflective surface of said laser light source providing one reflector of a laser cavity;
- a lensed optical fiber light target disposed in said plane with a tip at a second position in said plane and a fiber axis aligned with incident light;
- a spherical reflector disposed in an optical path between said light source and said light target, said spherical reflector having a first center of curvature on an axis bisecting a baseline between said light source and said fiber axis of said light target, said spherical reflector having an aperture; and
- spherical grating means for selecting wavelength of optical radiation on said optical path between said light source and said light target, said spherical grating means having a second center of curvature on said axis bisecting said baseline and a radius of curvature twice the radius of curvature of said spherical reflector such that zeroeth order reflections are along a path between said laser light source and said lensed optical fiber light target, said planar grating having a backscatter diffraction maximum in the gain profile of said laser light source with sufficient reflectivity, upon reflection through said aperture to support lasing.

4. A fiber optic coupler module wherein either a source or a target is a lensed optical fiber, said module comprising:
- a broadband light emitting diode light source disposed at a first position in a plane including a center of curvature of a spherical grating;
- a plurality of lensed optical fiber light targets disposed in said plane, each one of said targets with a tip at a second position in said plane and a fiber axis aligned to receive incident light from said grating and disposed on a circle having a first center of curvature; and
- spherical grating means for selecting wavelength of optical radiation on an optical path between said light source and said light targets, said spherical grating means having a second center of curvature on said circle and a radius of curvature twice the radius of curvature of said circle such that high order reflections at selected frequencies are along a path between said light source and said lensed optical fiber light targets.

5. A fiber optic coupler module wherein either a source or a target is a lensed optical fiber, said module comprising:
- a first light source disposed in a planar region at a first position in a plane including a first center of curvature of a first spherical reflector;
- a first light target disposed at a second position in said planar region having an incident light axis aligned with incident light;
- a first spherical reflector disposed in an optical path between said first light source and said first light target, said first reflector having said first center of curvature halfway between said first light source and said incident light axis of said first light target;
- first means for selecting wavelength of optical radiation on said optical path between said first light source and said first light target comprising a dichroic dielectric coating on a surface of said first spherical reflector, said coating having a first selected broad-width wavelength reflectivity centered on a desired wavelength of said light source and a desired transmissivity at other wavelengths;
- a second light source disposed in a planar region at a second position in a plane including a second center of curvature of a second spherical reflector;
- a second light target disposed at a second position in said planar region having an incident light axis aligned with incident light;
- a second spherical reflector disposed in an optical path between said second light source and said second light target, said second reflector having said second center of curvature halfway between said second light source and said incident light axis of said second light target, said first spherical reflector being located between said second spherical reflector and said second light source;
- second means for selecting wavelength of optical radiation on said optical path between said second light source and said second light target comprising a dichroic dielectric coating on a surface of said second spherical reflector, said coating having a second selected broad-width wavelength reflectivity centered on a desired wavelength of said light source and a desired transmissivity at other wavelengths;
- a third light source disposed in a planar region at a third position in a plane including a third center of curvature of a third spherical reflector;
- a third light target disposed at a third position in said planar region having an incident light axis aligned with incident light; and
- a third spherical reflector disposed in an optical path between said third light source and said third light target, said third reflector having said third center of curvature halfway between said third light source and said incident light axis of said third light target, said first spherical reflector and said second spherical reflector being located between said third spherical reflector and said third light source;
- wherein a lensed optical fiber simultaneously comprises a light target and a light source.

* * * * *